United States Patent
Shiraishi

(10) Patent No.: US 8,536,512 B2
(45) Date of Patent: Sep. 17, 2013

(54) OPTO-ELECTRONIC CIRCUIT BOARD AND MANUFACTURING METHOD FOR THE SAME

(75) Inventor: Takashi Shiraishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 282 days.

(21) Appl. No.: 12/943,050

(22) Filed: Nov. 10, 2010

(65) Prior Publication Data

US 2011/0108716 A1 May 12, 2011

(30) Foreign Application Priority Data

Nov. 12, 2009 (JP) ................................. 2009-259160

(51) Int. Cl.
*G02B 6/42* (2006.01)
*G02B 6/26* (2006.01)

(52) U.S. Cl.
USPC ..................... 250/227.24; 250/214.1; 385/14; 385/39; 385/88; 257/779

(58) Field of Classification Search
USPC ................. 250/214.1, 208.1, 227.11, 227.24; 385/14, 15, 31–33, 39, 88; 257/778, 779, 257/780
See application file for complete search history.

(56) References Cited

U.S. PATENT DOCUMENTS

| | | | |
|---|---|---|---|
| 6,389,202 B1 * | 5/2002 | Delpiano et al. | 385/49 |
| 7,230,278 B2 | 6/2007 | Yamada et al. | |
| 7,427,804 B2 | 9/2008 | Yamada et al. | |
| 7,466,880 B2 * | 12/2008 | Windover | 385/14 |
| 2011/0019960 A1 | 1/2011 | Matsubara et al. | |

FOREIGN PATENT DOCUMENTS

| | | |
|---|---|---|
| JP | 5-13938 A | 1/1993 |
| JP | 2005-79385 A | 3/2005 |
| JP | 2007-180078 A | 7/2007 |
| JP | 2009-139758 A | 6/2009 |
| WO | WO-2009-119850 A1 | 10/2009 |

OTHER PUBLICATIONS

Matsuoka, Y. et al.,"160 Gbps Compact Optical I/O Module with High Optical Coupling Efficiency", Proceedings of the 2008 IEICE General Conference Mar. 2008, pp. 264 (pp. 1-3 English translation).

* cited by examiner

*Primary Examiner* — Kevin Pyo
(74) *Attorney, Agent, or Firm* — Fujitsu Patent Center

(57) ABSTRACT

There is provided an opto-electronic circuit board that includes a first board, a second board coupled with the first board via solder, where the second board is mounted with an electronic circuit and a photoelectrical conversion device, and a wall disposed between an optical coupling portion and the solder. The optical coupling portion is for optically coupling an optical waveguide with the photoelectric conversion device, where the optical waveguide is formed in the first board.

16 Claims, 14 Drawing Sheets

OPTO-ELECTRONIC CIRCUIT BOARD AND MANUFACTURING METHOD FOR THE SAME

CROSS-REFERENCE TO RELATED APPLICATION

This application is based upon and claims the benefit of priority of the prior Japanese Patent Application No. 2009-259160, filed on Nov. 12, 2009, the entire contents of which are incorporated herein by reference.

FIELD

The embodiments discussed herein are related to an opto-electronic circuit board and a manufacturing method for the circuit board.

BACKGROUND

The recent development in a server and a high-end computer cause the central processing unit (CPU) to communicate vastly increasing data with the outer circuits, while the number of pins formed on a package including the CPU is limited for avoidance of electrical interference among the pins. For breaking the limitation of the number of pins, a photoelectric conversion device is provided within the CPU package for use of optical interconnection technology to allow a vast transmission with the outer circuits, that is, the CPU and the outer circuits are optically interfaced.

It is preferable to supply into the market the products adopting both of the optical and electrical connection technology not only the optical connection technology until the optical connection technology will become to be applied to products in the aspects of cost and compatibility to existing devices. Thus, it is desirable for the optical connection technology to be used together with the electrical connection technology.

As the electrical connection technology for connecting an LSI package and a printed circuit board, the ball grid array (BGA) assembling scheme is well known. In this scheme, a plurality of solder balls arranged between the LSI package and the circuit board are melted in a reflow treatment and subsequently solidified to electrically couple the package and the board. Various types of opto-electronic packages are proposed recently as disclosed in Japanese Laid-open Patent Publications 2005-79385 and 2009-139758 and Y. Matsuoka et al., "160 Gbs Compact Optical I/O Module with High Optical Coupling Efficiency", Proceedings of the 2008 IEICE General Conference, p. 264, 2008.

Japanese Laid-open Patent Publications 2005-79385 has proposed the structure in which a printed circuit board is mounted on an electro optical circuit board via ball electrodes, where the printed circuit board includes a hole for light passing input and output optical signals through the printed circuit board.

Japanese Laid-open Patent Publications 2009-139758 has proposed the structure in which the opto-electronic circuit board is mounted on the board having an optical waveguide via solder balls, where on the opto-electronic circuit board are provided an optical device and an IC chip. The opto-electronic circuit board has a structure like an optical waveguide for optical transmission in the direction of the thickness of the board and a projection for defining the small air gap between the opto-electronic circuit board and the board so as to decrease the optical connection loss.

The reference by Y. Matsuoka et al. has proposed a structure of a lens system improving a tolerance toward a position gap of an optical device, avoiding an optical loss caused by misalign of the optical device, when assembled on the board with an optical waveguide by BGA method.

Each of Japanese Laid-open Patent Publications 2005-79385 and 2009-139758 and the reference by Y. Matsuoka et al. have disclosed that the opto-electronic circuit board is mounted on the board having the optical waveguide by the use of BGA method. Their objects are to decrease the optical loss caused by the air gaps between the opto-electronic circuit board and the board having optical waveguide and by the positional misalignment of optical elements.

For knowing electronic circuit board, means for preventing the scattering of solder flux is disclosed in Japanese Laid-open Patent Publications 05-13938 and 2007-180078. In detail, Japanese Laid-open Patent Publication 05-13938 discloses the method which provides a depressed portion on a solder resist applied to the board as a reservoir of scattered solder flux. Japanese Laid-open Patent Publication 2007-180078 discloses an area applied with the solder resist except a depressed portion the on the board.

SUMMARY

According to an aspect of the invention, an opto-electronic circuit board includes a first board, a second board coupled with the first board via solder, and a wall. The second board is mounted with an electronic circuit and a photoelectric conversion device and the wall is disposed between an optical coupling portion and the solder, where the optical coupling portion is for optically coupling an optical waveguide with the photoelectric conversion device and the optical waveguide being formed in the first board.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the case of bonding the opto-electronic package, such as the opto-electronic circuit board, to the board, it is necessary to melt the solder balls to electrically connect between the package and the board by a reflow treatment in which a process higher than 200° C. performed. When performing the reflow treatment, it may cause scattering of solder flux and or solder particles resulting in increasing optical loss by adhesion of the solder flux or solder particles to a light path. Accordingly, for practical application of the opto-electronic circuit board, it is necessary a manner that prevents the scattering of the solder flux and the solder particles from adhering to the light path to avoid degradation of optical insertion loss and yielding ration of the product including the opto-electronic circuit board, while the manner is not disclosed in Japanese Laid-open Patent Publications 2005-79385 and 2009-139758 and the reference by Y. Matsuoka et al.

In addition, the technologies disclosed in Japanese Laid-open Patent Publications 05-13938 and 2007-180078 may increase the scattering particles to the degree of prevention of electrical terminals from insufficient electrical insulation which will be caused by the scattering of flux and or solder particles. However, the large amount of optical loss is caused by adhesion of the scattering particles to the optical path of an optical coupling portion when the scattering particles is of little amount and even several micrometers in diameter.

With reference to the drawings, the embodiments of the present invention will be explained.

The First Embodiment

Figure 1:
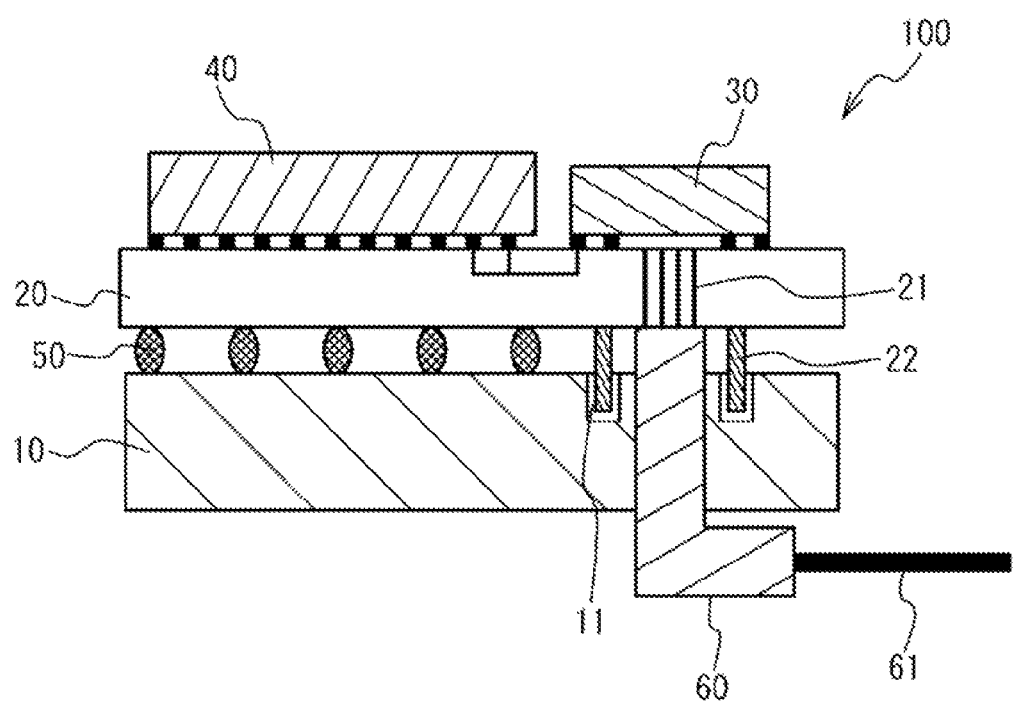
FIG. 1 is a diagram illustrating an opto-electronic circuit board according to a first embodiment.

FIG. 1 is a schematic section view of an opto-electronic circuit board according to the first embodiment. The opto-electronic circuit board 100 includes an electronic circuit board 10 as a first board, an interposer 20 as a second board, a photoelectric conversion device array 30, and an electronic circuit 40. For clarity, the hatch is not illustrated in the section view of the interposer 20 in FIG. 1, while the electrical wirings and optical waveguides 21 described later are illustrated in the section view.

The electronic circuit board 10 is a printed circuit board and has wirings formed on the surface. The substrate of flame retardant type 4 (FR4) or the like may be available in a substrate of the electronic circuit board 10. The interposer 20 is a board for mounting the photoelectric conversion device array 30 and the electronic circuit 40. The interposer 20 is mounted on the electronic circuit board 10 via the solder balls 50 in manner of BGA. The ceramic substrate, the organic substrate or the like is available for use in the substrate of interposer 20 in which the optical waveguides 21 are formed in the thickness direction of the interposer 20.

The photoelectric device element array 30 includes at least one of the photoreceptor and the light emitting element, where the photoreceptor converts an optical signal to a corresponding electronic signal and the light emitting element converts an optical signal corresponding to an electronic signal as an input signal. The photoelectric conversion device is bonded to the interposer 20 in manner of flip chip attach via Au bumps. The photoreceptor is for example a photo-diode. The light emitting element is for example a vertical cavity emitting laser (VCSEL). The photoelectric conversion device of the photoelectric conversion device array 30 is optically coupled to the optical waveguide 21 in the interposer 20.

The electronic circuit 40 includes an electronic device for transmitting and receiving electronic signals between the photoelectric conversion device arrays 30. The electronic circuit 40 is for example an integral circuit such as a large-scale integration (LSI) and includes an electronic device for driving the photoelectric conversion device in the photoelectric conversion device array 30. The electronic circuit 40 is mounted on the interposer 20 via Au bumps in manner of flip chip attach.

A through hole is formed within the electronic circuit board 10 in which an optical connector 60 is inserted. The optical connector 60 is optically coupled to the optical waveguide array 61. The optical waveguide array 61 may be a fiber or a polymer optical waveguides. The optical waveguide array 61 is optically coupled to the optical waveguides 21 of the interposer 20 via the optical connector 60. The interposer 20 and optical connector 60 include individually a hole or a pin for alignment of connection of the both. The optical connector 60 may be passively aligned by inserting the pin into the hole.

A groove 11 is formed on a surface, of the electronic circuit board 10, opposing the interposer 20, while a flux prevention wall 22 is formed on a surface of, of the interposer 20, opposing the electronic circuit board 10. The flux prevention wall includes a projection toward the electronic circuit board 10 as illustrated in FIG. 1. The flux prevention wall 22 fits into the groove 11 and is formed between the solder balls 50 and the optical connector 60.

Figure 2A:
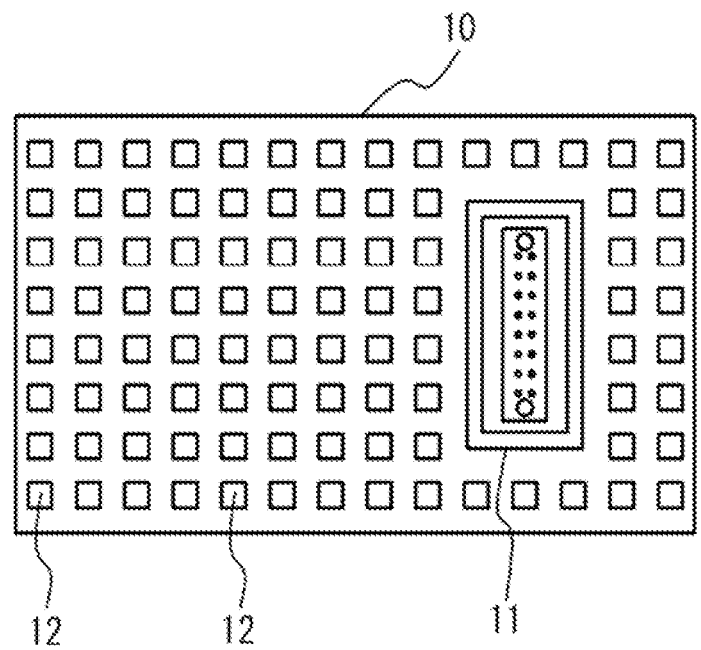
FIG. 2A is a diagram illustrating a plane view of a surface, which opposes an interposer, of an electronic circuit board and FIG. 2B a diagram illustrating a plan view of a surface, which opposes the electronic circuit board, of the interposer.
Figure 2B:
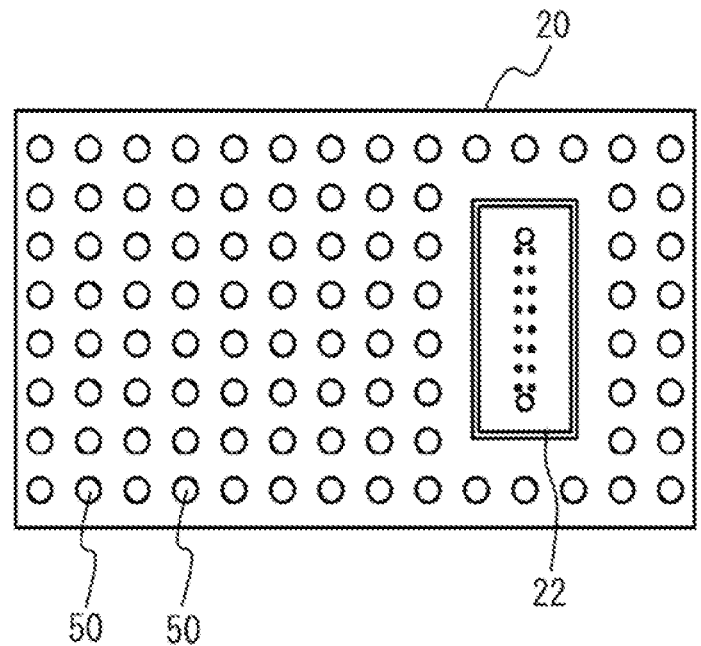

FIG. 2A illustrates an example of a plan view of the surface, of the electronic circuit board 10, opposing the interposer 20. FIG. 2B an example of a plan view of the surface, of the interposer 20, opposing the electronic circuit board 10.

As illustrated in FIG. 2A, the solder balls 12 are provided on the surface of the electronic circuit board 10 opposing the interposer 20. The groove 11 is formed at a position which surrounds the optical connector 60. As illustrated in FIG. 2B, the solder balls 50 are arranged at positions each of which is opposing the position of the corresponding pad 12, for the solder ball, formed on the electronic circuit board 10.

In the opto-electronic circuit board 100, the electronic circuit 40 transmits and receives the electric signals to and from the photoelectric conversion device included in the photoelectric conversion device array 30. When the array 30 includes a light emitting element, the array 30 outputs light based on the electric signal from the electronic circuit 40. The light output is output to the outer circuit via the optical waveguide 21 in the interposer 20, the optical connector 60, and the optical waveguide array 61. When the photo conversion device array 30 includes the photoreceptor, the array 30 converts to electric signal the optical signal input via the optical waveguide array 61, the optical connector 60, and the optical waveguide 21 and transmits the electric signal to the electronic circuit 40.

Figure 3A:
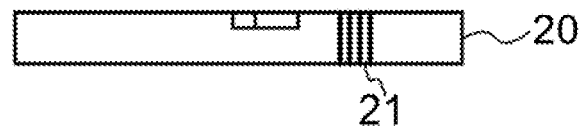
FIGS. 3A to 3E are diagrams for explaining a flow of procedures for manufacturing the opto-electronic circuit board.

FIGS. 3A to 3E are diagrams for explaining a flow of procedures for manufacturing the opto-electronic circuit board 100. With reference to FIG. 3A, the through holes 21 are formed in the direction of the thickness of the interposer 20 by irradiating a laser beam to the interposer 20 which includes electrical transmission lines for electrically connecting the electronic circuit 40 and the photoelectric conversion device array 30. Then the through holes are filled with resin to form the optical waveguides 21. It is preferable to form a hole for aligning the optical connector 60 when forming the through holes.

Figure 3B:
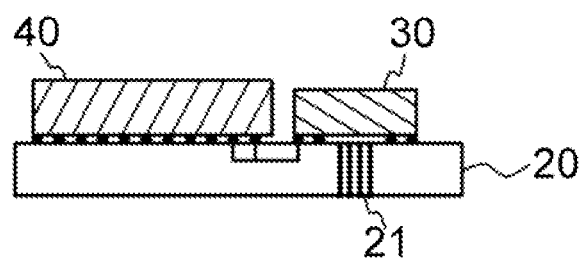
Figure 3C:
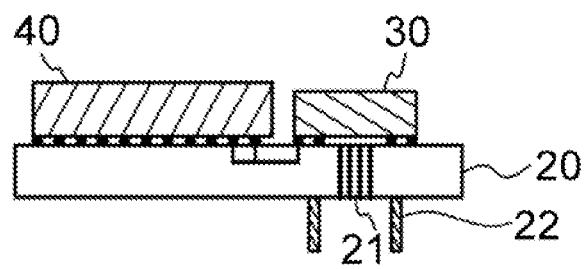

After forming the optical waveguides 21, the electronic circuit 40 and the photoelectric conversion device array 30 are electrically connected to the interposer 20 in the manner of flip chip attachment as illustrated in FIG. 3B. The flip chip attachment may be performed by pressure bonding to metallically join the electronic circuit 40 with the interposer 40 by use of Au bumps. After the process illustrated in FIG. 3B, the flux prevention wall 22 is formed on the interposer 22 as illustrated in FIG. 3C. The flux prevention wall may be formed in manner of processing the surface, of the interposer 20, opposing the electronic circuit board 10 or adhering the flux prevention wall to the interposer 20. The material of the flux prevention wall 22 has preferably a coefficient of thermal expansion equal to or close to that of the interposer 20.

Figure 3D:
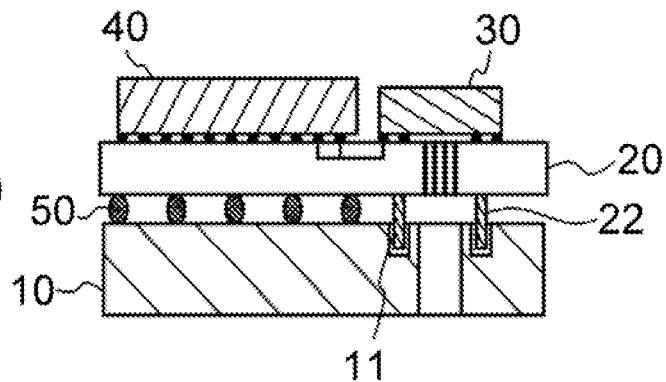
Figure 3E:
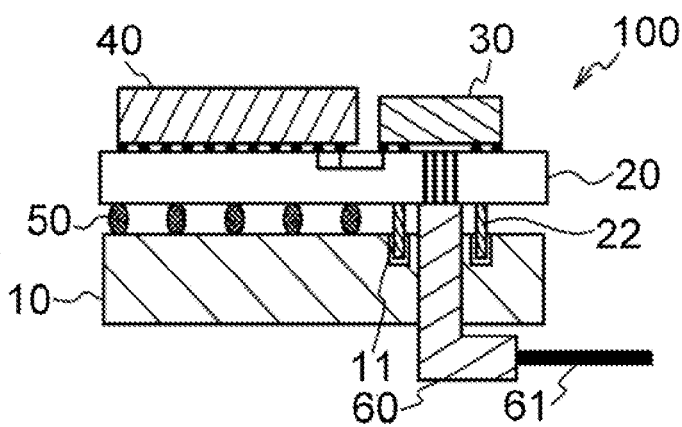

As the next process after that illustrated in FIG. 3C, the interposer 20 is set on the electronic circuit board 10 via the solder balls 50 so as to fit the flux prevention wall 22 to the groove 11 as illustrated in FIG. 3D. The groove 11 may be formed by a processing equipment such as a router used for machining a commonly used printed board. Sequentially to perform BGA attachment, the solder balls 50 are melted by the reflow treatment and then solidified to fix the interposer 20 on the electronic circuit board 10.

After the process illustrated in FIG. 3D, the optical connector 60 is inserted into the through hole to be optically coupled with the optical waveguide 21 in the interposer 20. The optical connector may be made of resin by the manner of injection molding. A mechanically transferable (MT) type or a 90 degree bent type optical connector, refer to Japanese patent Publication 4268177 for example, is used as the optical connector 60. The optical connector 60 includes 2×8 channels for example as illustrated in FIG. 2A. By the processes described above, the opto-electronic circuit board 100 is manufactured.

Since the opto-electronic circuit board 100 includes the flux prevention wall 22 provided at between the solder balls 50 and the optical coupling portion at which the optical waveguide 21 is optically coupled with the optical connector 60, the scattering prevention wall 22 prevent the optical coupling portion from adhesion of the scattering of flux and particles. Accordingly, the optical loss caused by the adhesion may be suppressed.

The First Modified Example of the First Embodiment

Figure 4:
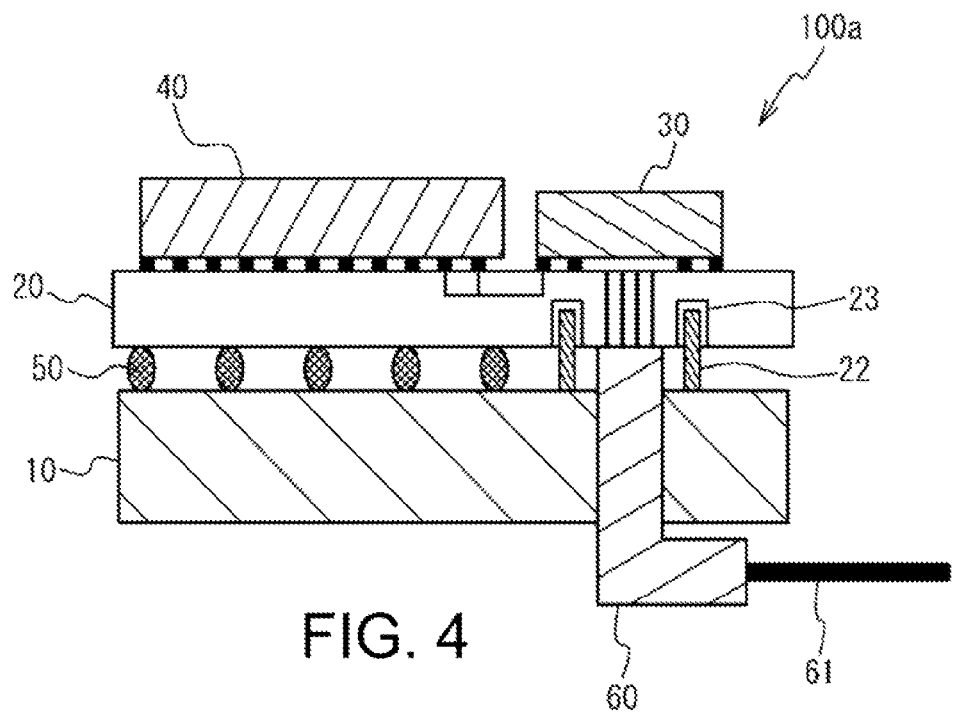
FIG. 4 is a diagram illustrating a schematic section view of the opto-electronic circuit board.

FIG. 4 illustrates a schematic section view of the opto-electronic circuit board 100a as the first modified example according to the first embodiment. The opto-electronic circuit board 100a includes the flux prevention wall 22 fixed to the electronic circuit board 10 and the groove 23 formed on the interposer 20. The flux prevention wall 22 is arranged on the surface, of the electronic circuit board 110, opposing the interposer 20 so as to project toward the interposer 20. The groove 23 is formed on the surface, of the interposer 20, opposing the electronic circuit board 10 so as to fit the flux prevention wall 22. In the first modified example, the scattering of flux and the particles may be prevented from adhering to the optical coupling portion when the solder balls 50 are melted at the reflow treatment.

The Second Modified Example of the First Embodiment

Figure 5:
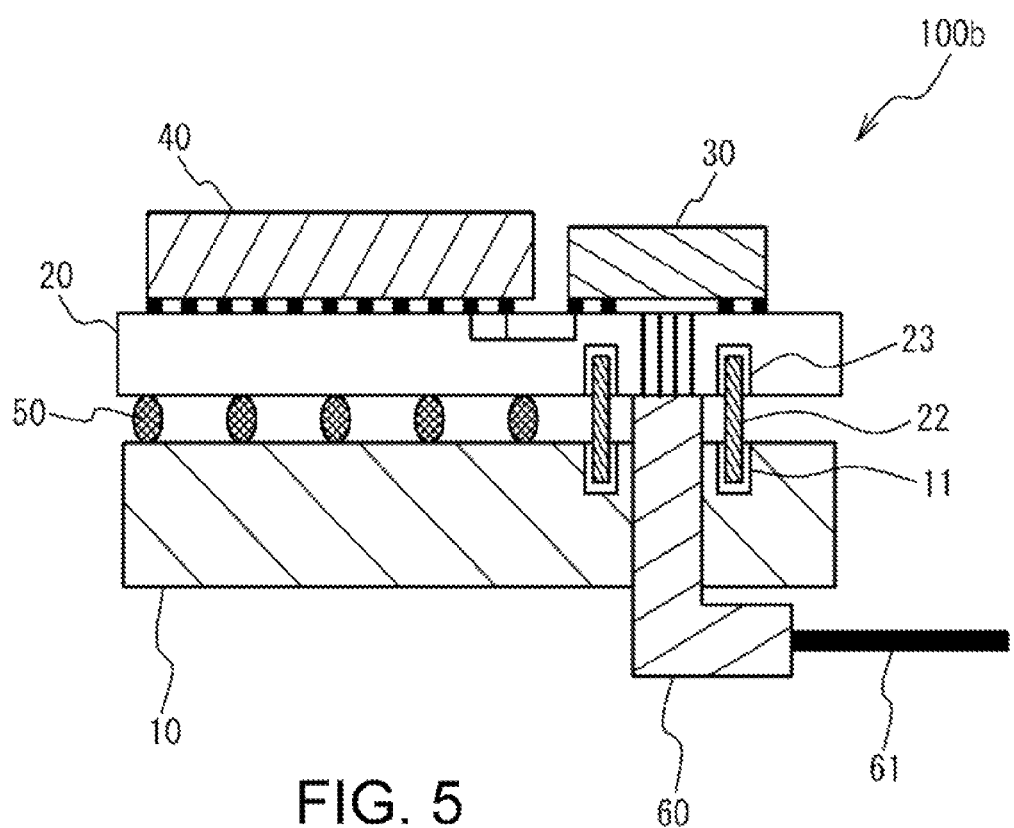
FIG. 5 is a diagram illustrating a schematic section view of the opto-electronic circuit board.

FIG. 5 illustrates a schematic section view of the opto-electronic circuit board 100b as the second modified example according to the first embodiment. In this example, the flux prevention wall 22 is arranged without fixing to both the electronic circuit board 10 and the interposer 20. The grooves 11 and 23 are formed in the electronic circuit board 10 and the interposer 20 respectively so that the grooves 11 and 23 are opposed each other. Thus, the flux prevention wall 22 may fit to both grooves 11 and 23.

Figure 6A:
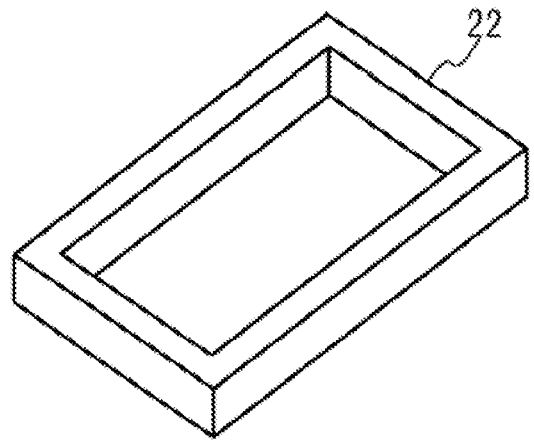
FIGS. 6A to 6C are diagrams illustrating a process flow for manufacturing the opto-electronic circuit board.
Figure 6B:
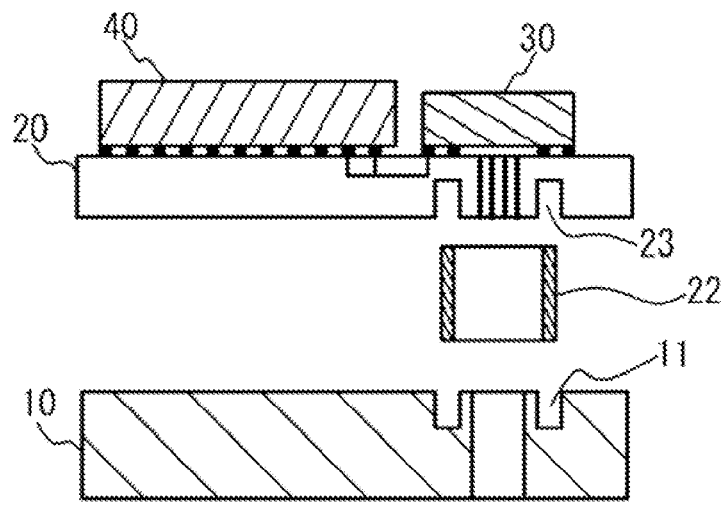
Figure 6C:
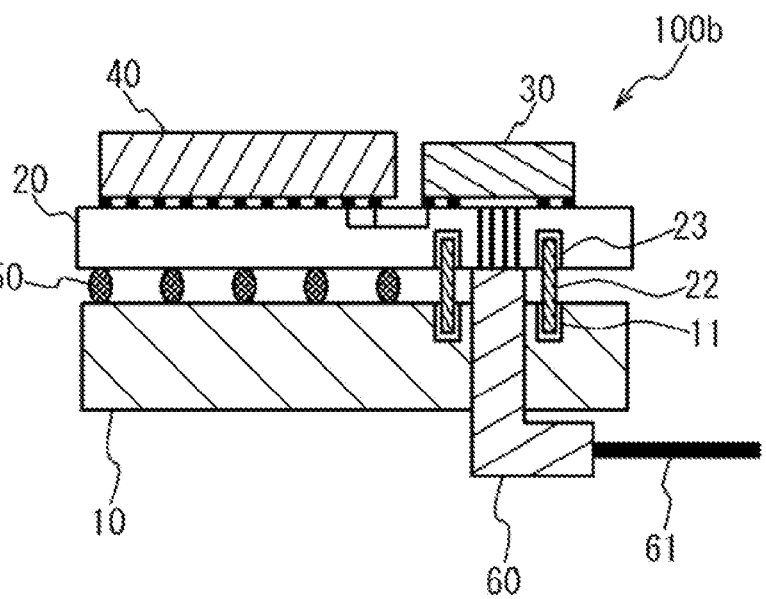

FIGS. 6A to 6C are diagrams illustrating the process flow for manufacturing the opto-electronic circuit board 100. FIG. 6A illustrates the flux prevention wall 22 fabricated independently from the electronic circuit board 10 and the interposer 20. The flux prevention wall is formed into a rectangle shape according to the present modified example as illustrated in FIG. 6A. The flux prevention wall 22 is fitted to both the grooves 11 and 23 as illustrated in FIG. 6B. Then the interposer 20 is assembled in the manner of BGA attachment by melting the solder balls 50 using reflow treatment and solidifying the melted solder balls 50 as illustrated in FIG. 6C. Even in the opto-electronic circuit board according to the present modified example, the scattering flux and particles may be prevented from adhering to the optical coupling portion in the board 100b when melting the solder balls 50 at the reflow treatment. Accordingly, the optical loss at the optical coupling portion may decrease. In addition, since the flux prevention wall 22 is fabricated independently from the electronic circuit board 10 and the interposer 20, the flux prevention wall forming process is omitted from the forming process of the electronic circuit board 10 or the interposer 20.

The Third Modified Example of the First Embodiment

Figure 7:
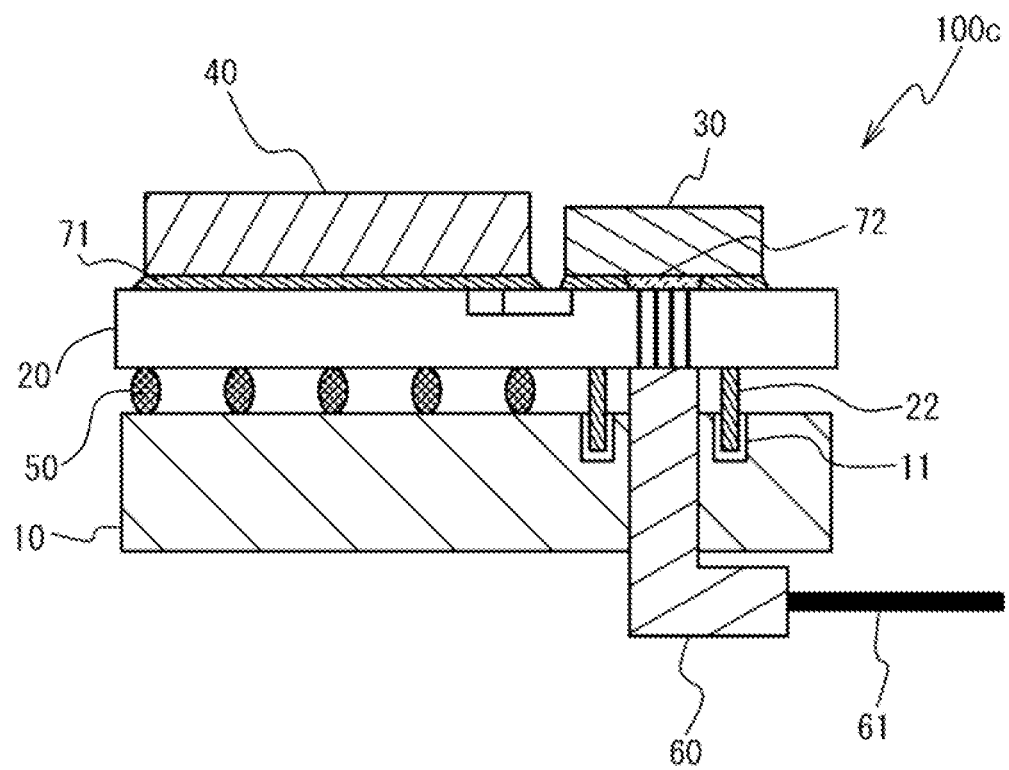
FIG. 7 is a diagram illustrating a schematic section view of the opto-electronic circuit board.

FIG. 7 illustrates a schematic section view of the opto-electronic circuit board 100c as the third modified example according to the first embodiment. In the present example, there are provided underfill material 71 and transparent filling material 72. The underfill material 71 is applied to between electronic circuit 40 and interposer 20 for reducing the difference in the thermal expansions of the electronic circuit 40 and the interposer 20. The underfill material 71 may be applied after fixing the electronic circuit 40 to the interposer 20 in the manner of the flip chip attachment. The underfill material 71 may be the mixture of epoxy resin and filler such as alumina As described above, the filler is added to the resin such as epoxy resin for adjusting the coefficient of thermal expansion of the underfill material 71, however the filler degrades the transparency of the underfill material 71. Accordingly, the underfill material 71 causes the increase of optical loss when the underfill material 71 spreads under the photoelectric conversion device 30. Preventing the increase of the optical loss, transparent filler 72 composed of transparent resin is applied to between the photoelectric conversion device array 30 and the interposer 20 before wiring the electronic circuit 40 to the interposer 20 in the manner of flip chip attachment. The transparent filler 72 is for example epoxy resin without filler or acrylate resin.

Figure 8A:
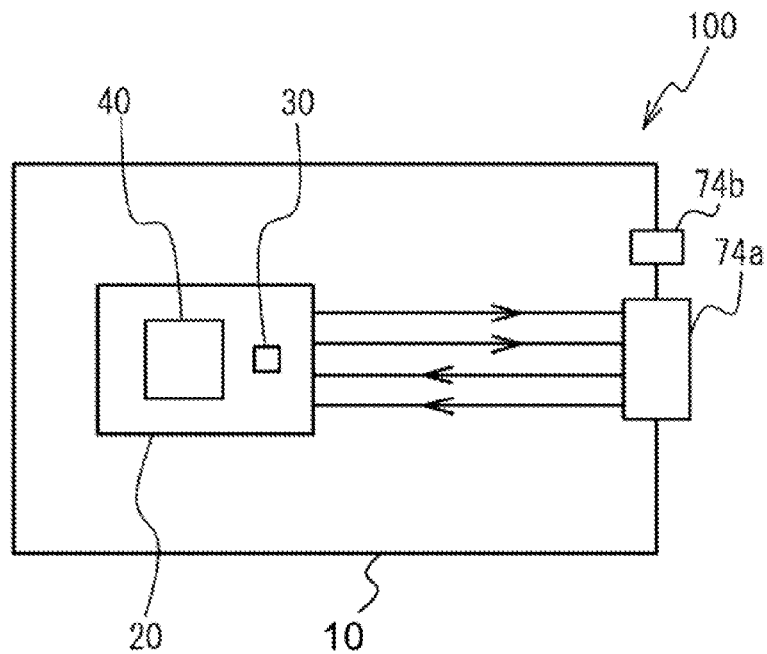
FIGS. 8A and 8B are diagrams illustrating the opto-electronic circuit board applied to a high-end computer.
Figure 8B:
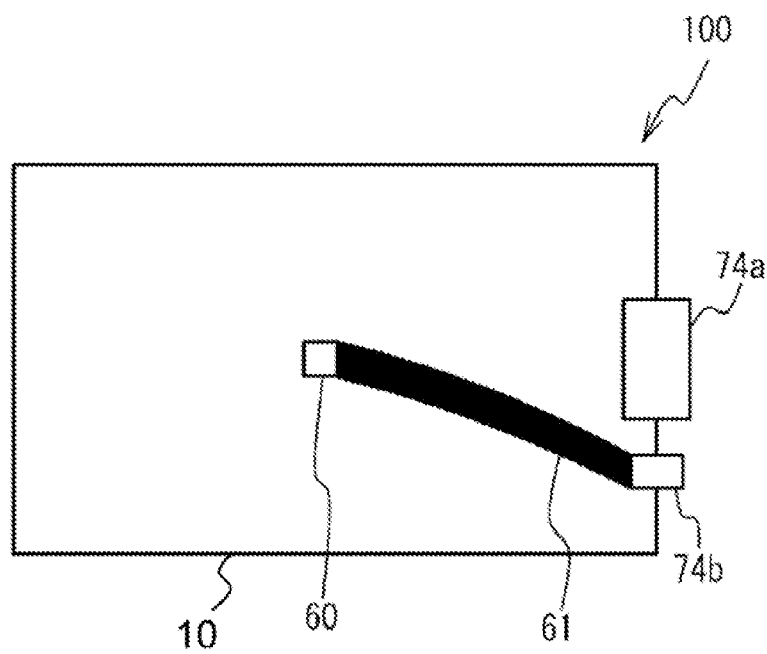

FIGS. 8A and 8B are diagrams for explaining the opto-electronic circuit board 100 applied to the high-end computer (HPC), while the same holds for the opto-electronic circuit boards 100a, 100b, and 100c which are not illustrated in FIGS. 8A and 8B. FIG. 8A illustrates a top plan view of the opto-electronic circuit board 100 arranged in the HPC. The electric signals output from the opto-electronic circuit board 100 are sent to a back plane (not illustrated) via an electric connector 74a arranged at an edge of the electronic circuit board 10. FIG. 8B illustrates a bottom view of the opto-electronic circuit board 100 arranged in the HPC. The optical signals output from the opto-electronic circuit board 100 are sent to the back plane (not illustrated) via an optical connector 74b arranged at the edge of the electronic circuit board 10. However, the optical signals may be sent directly to the back plane without the optical connector 74b, while the optical signals are sent to the back plane via the optical connector 74b.

The first embodiment is not limited to the examples described above. The electronic circuit 40 may includes an LSI and a driver for driving the photoelectric conversion device. In addition, it may be preferable to arrange the LSI and the driver separately. The optical connector 60 may be arranged in the manner of the passive alignment using a guide hole and guide pin or the active alignment. Further, a plurality of optical connectors may be arranged for increase of the transmission rate by use of more channels to increase the transmission rate.

The Second Embodiment

The second embodiment will be explained with reference to FIG. 9 in which illustrates a schematic section view of the opto-electronic circuit board 101 according to the second embodiment. The opto-electronic circuit board 101 does not include the optical waveguide 21 unlike the opto-electronic circuit board 100 according to the first embodiment. However, instead of the optical waveguide 21 the opto-electronic circuit board 101 includes the microlens arrays 73a and 73b opposing each other for optically coupling across an air gap the photoelectric conversion device array 30 and the optical waveguide array 13 arranged on the electronic circuit board 10. The microlens arrays 73a and 73b collimate the outgoing optical signals and focus the incident optical signals.

In more detail, on the surface of the photoelectric conversion device array 30, the microlens array 73a is disposed so as to oppose to the electronic circuit board 10. On the surface of the electronic circuit board 10, the microlens array 73b is disposed opposing the photoelectric conversion device array 30. The interposer 20 has a through hole so that the microlens arrays 73a and 73b may be optically coupled each other. The optical waveguide array 13 is optically coupled with the microlens array 73b and extends to one of the edges of the electronic circuit board 10.

The optical waveguide array 13 may be fabricated by exposing and developing the polymer material laminated on the electronic circuit board 10. Accordingly, the same process is applicable to fabricate the electronic circuit board 10 and the optical waveguide array 13.

Figure 9:
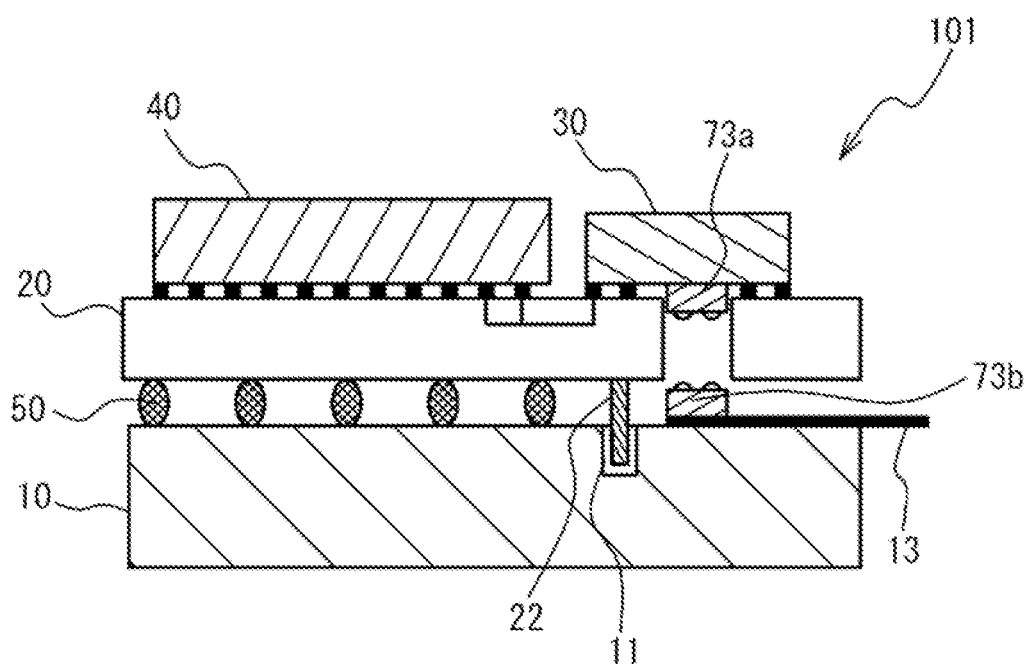
FIG. 9 is a diagram illustrating a schematic section view of the opto-electronic circuit board.
Figure 10A:
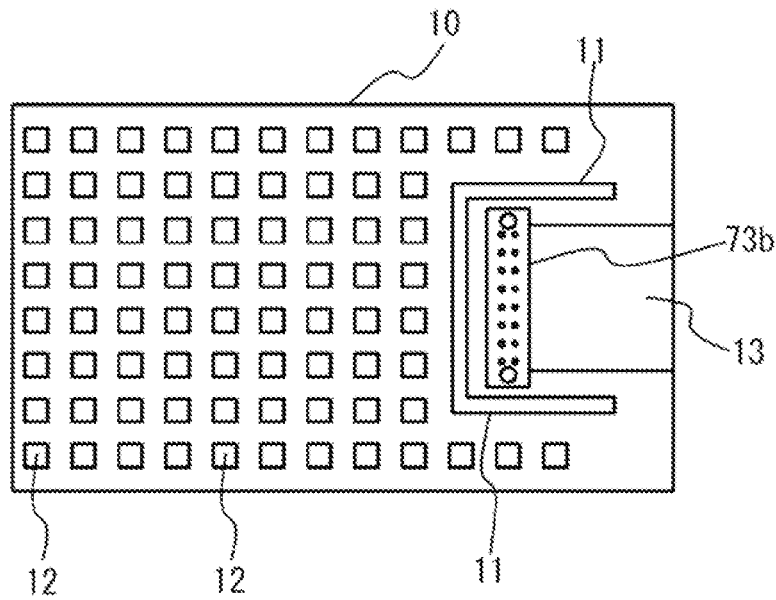
FIG. 10A is a diagram illustrating a plan view of a surface, of the electronic circuit board, opposing the interposer.
Figure 10B:
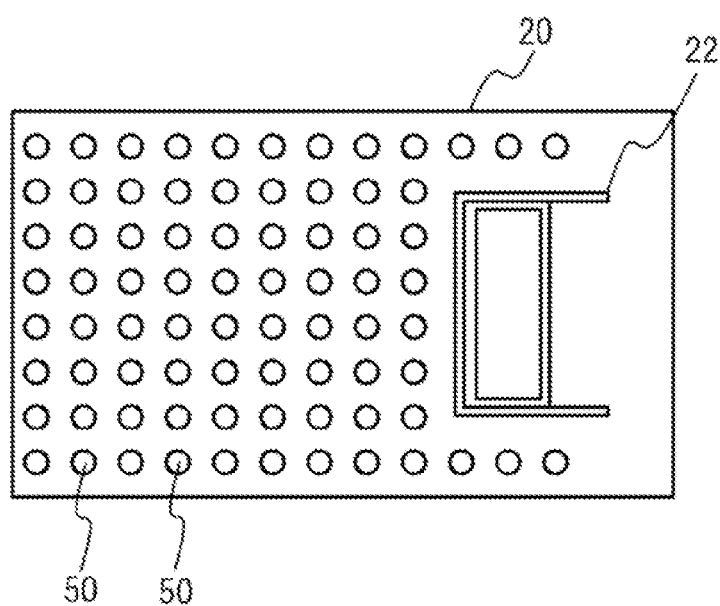
FIG. 10B is a diagram illustrating a plan view of a surface, of the interposer, opposing the electronic circuit board.

In the present embodiment, the flux prevention wall 22 formed separately from the region at which the optical waveguide array 13 is disposed as illustrated in FIG. 9. FIG. 10A is a plan view of an example of the surface, of the electronic circuit board 10, opposing the interposer 20. FIG. 10B is a plan view of an example of the surface, of the interposer 20, opposing the electronic circuit board 10. As illustrated in FIGS. 10A and 10B, the groove 11 and the flux prevention wall 22 are formed in a U or C shape.

Figure 11:
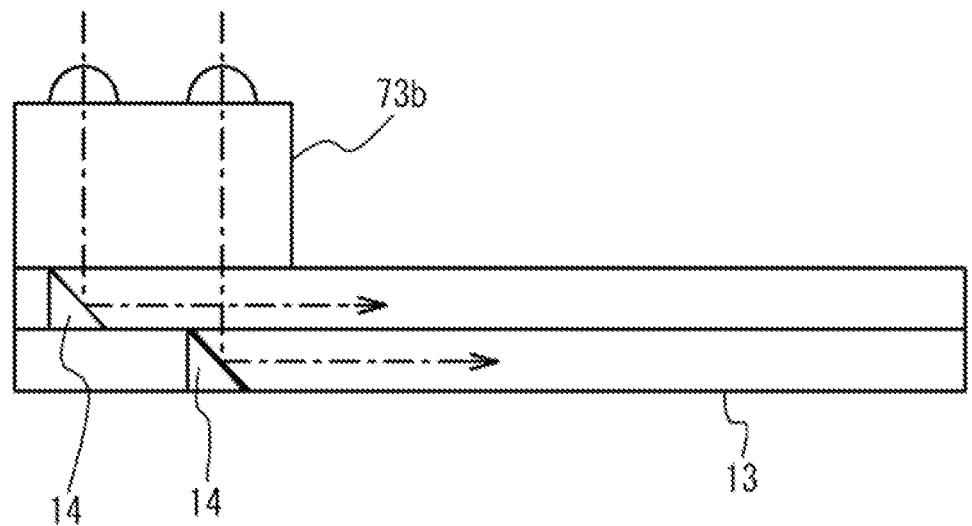
FIG. 11 is a diagram illustrating an optical coupling portion between a microlens array and an optical waveguide array.

FIG. 11 is a schematic diagram illustrating the optical coupling portion between the microlens array 73b and the optical waveguide array 13. As illustrated in FIG. 11, the microlens array 73b is optically coupled with the optical waveguide array 13 by arranging 45° mirror 14 at a position where the optical waveguide array 13 and the microlens array 45 are desired to be optically coupled with each other. The optical waveguide used in the optical waveguide array 13 may be a multilayer having layers more than three, while the two-layer optical waveguide array 13 is illustrated in FIG. 11. The 45° mirror 14 may be fabricated in the optical waveguide by dicing processing, laser beam processing or the like. The microlens array 73a and 73b may be mounted with high positional accuracy on each corresponding position by use of a chip mounter used at mounting electronic parts on an electronic circuit board.

In the present embodiment, the scattering of flux and the particles may be prevented also from adhering to the optical coupling portion formed of the microlens arrays 73a and 73b and the optical path between them when the solder balls 50 are melted at the reflow treatment. As a result, the degradation in the optical loss may be prevented that will be caused by the scattering of flux and the particles.

The First Modified Example of the Second Embodiment

Figure 12:
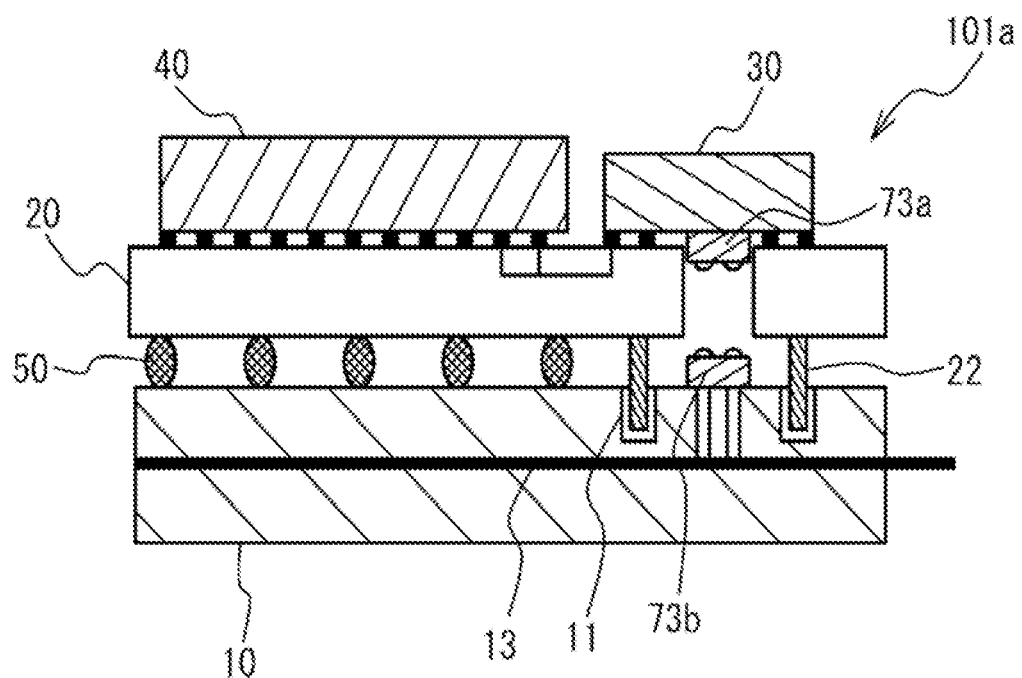
FIG. 12 is a diagram illustrating a schematic section view of the opto-electronic circuit board.

FIG. 12 is a schematic section view of the opto-electronic circuit board 101a according to the first modified example of the second embodiment. The electronic circuit board 10 may be fabricated of a multi-layer board with, for example, 10 to 20 layers, which allows an optical waveguide 13 to be arranged in the electronic circuit board 10 as illustrated in FIG. 12. The electronic circuit board 10 includes a hole which allows the microlens array 73b and the optical waveguide array 13 to be optically coupled with each other.

As illustrated in FIG. 12, it is not necessary to form the optical waveguide 13 on the electronic circuit board 10. Accordingly, the flux prevention wall 22 may be formed so as to surround the microlens array 73b. Thus, the scattering of flux and the particles may be prevented more effectively from adhering to the optical coupling portion formed of the microlens arrays 73a and 73b and the optical path between them when the solder balls 50 are melted at the reflow treatment. As a result, the degradation in the optical loss may be prevented more effectively that will be caused by the scattering of flux and the particles.

In addition, the flux prevention wall 22 may be formed to either of the interposer 20 or the electronic circuit board 10, or loosely fixed to them as illustrated in FIG. 5. Further, the underfill material may be filled in gaps between the photoelectric conversion device array 30 and the interposer 20, and between the electronic circuit board 40 and the interposer 20.

The Third Embodiment

Figure 13:
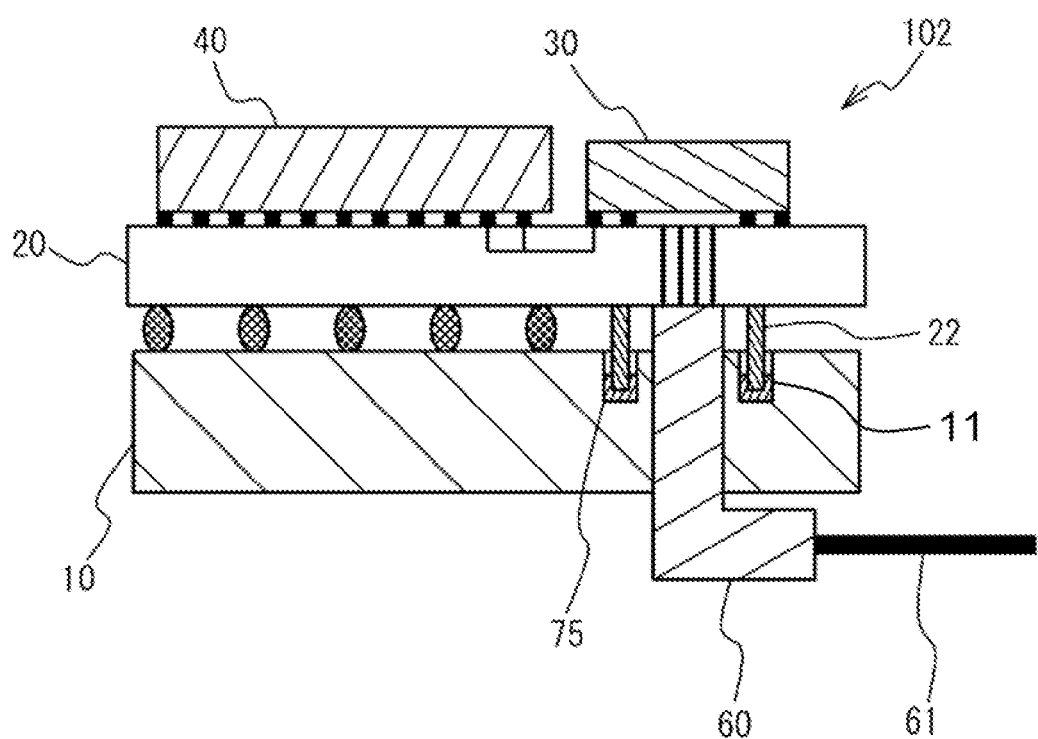
FIG. 13 is a diagram illustrating a schematic section view of the opto-electronic circuit board.

FIG. 13 is a schematic section view of the opto-electronic circuit board 102 according to the third embodiment. As illustrated in FIG. 13, the gap between the groove 11 and the flux prevention wall 22 is sealed by the thermoplastic resin 75 disposed between them. Thus, the scattering of flux and the particles may be prevented more effectively from adhering to the optical coupling portion. As a result, the degradation in the optical loss may be prevented more effectively that will be caused by the scattering of flux and the particles.

Figure 14:
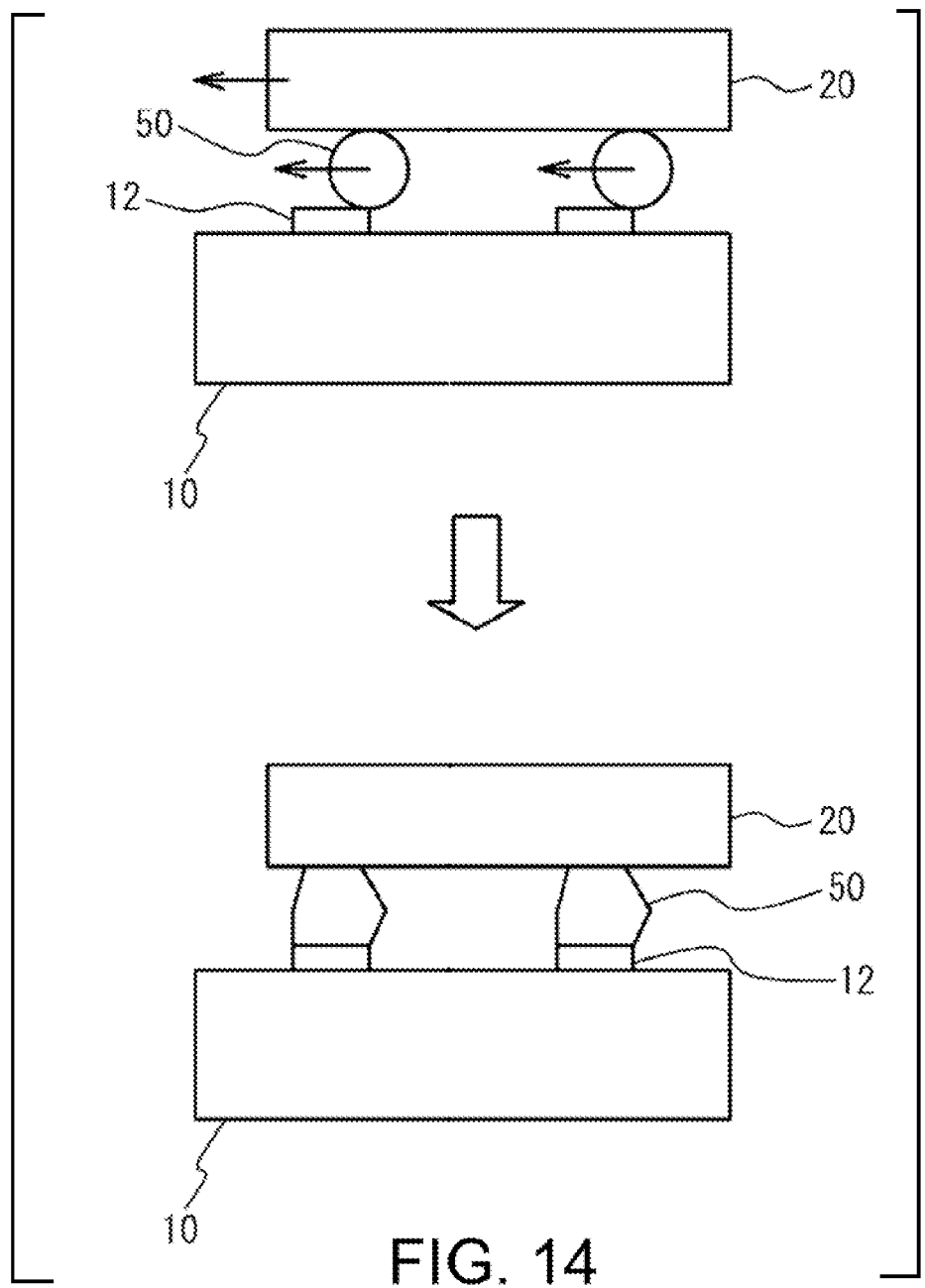
FIG. 14 is a diagram for explaining the self-aligning effect during performing a BGA attachment.

In addition, it is explained that the self-aligning effect may be performed in the BGA attachment using in the embodiments with reference to FIG. 14. The self-aligning effect is the effect that the interposer 20 is self-aligned with the electronic circuit board 10 by surface tension of the melted solder balls 50 during the reflow treatment under the presence of position gap between the interposer 20 and the board 10. For the self-aligning effect, the gap is preferably formed in the direction of thickness of the flux prevention wall 22.

After the reflow treatment, solidification of the thermoplastic resin 75 may seal the gap between the groove 11 and the flux prevention wall even if the gap is formed in the height or lateral direction of the flux prevention wall 22 between the groove 11 and the flux prevention wall 22. Thus, the flux prevention wall 22 is sealed to separate the inner space from an outer space surrounding the flux prevention wall 22. Accordingly, even if the groove 11 and the flux prevention wall 22 are formed with low machining accuracy, the optical coupling portion formed in the inner space of the flux prevention wall 22 is prevented effectively from the adhesion of the scattering flux and the particles or the like.

Figure 15A:
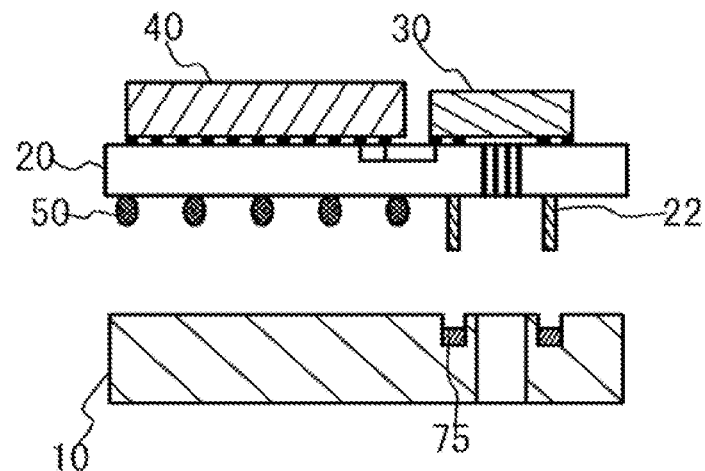
FIGS. 15A to 15C are diagrams for explaining the flow of a manufacturing method of the opto-electronic circuit board.
Figure 15B:
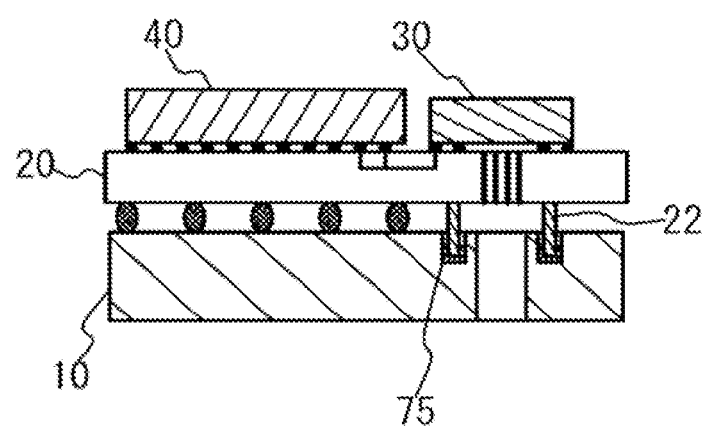
Figure 15C:
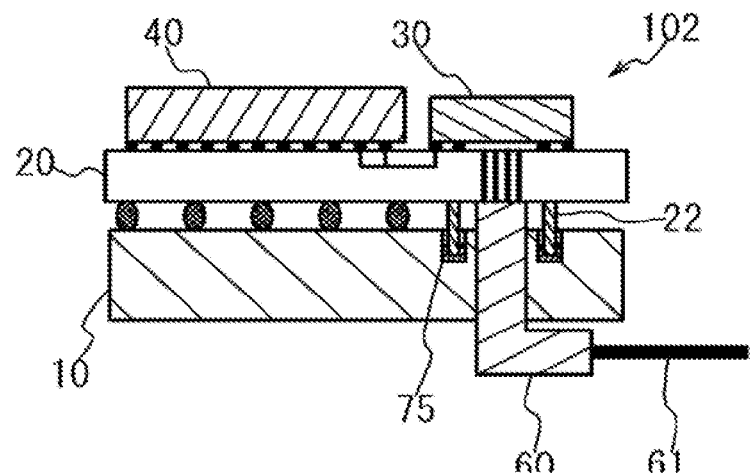

FIGS. 15A to 15C are diagrams for explaining the flow of the manufacturing method of the opto-electronic circuit board 102. As illustrated in FIG. 15A, the thermoplastic resin 75 is filled in the groove 11. The thermoplastic resin 75 may be a solid one at a room temperature or one in form mixed with organic solvent. As illustrated in FIG. 15B, the reflow treatment is performed to melt the solder balls 50 and at this processing the thermoplastic resin 75 turns soft. During decrease in temperature, the solder balls 50 become solidified and the self-align effect is achieved. The thermoplastic resin 75 turns in solid with further decrease in temperature to seal the gap between the groove 11 and the flux prevention wall 22. Next, the optical connector 60 is coupled with the optical waveguide 21 in the interposer 21 to assemble the opto-electronic circuit board 102 as illustrated in FIG. 15C.

It is preferable that the following relationships are satisfied for achievement of both the self-alignment in the electrical connection portion and the sealing by the thermoplastic resin 75:

(1) the melting temperature of the solder ball and the softening temperature of the thermoplastic resin are lower than the temperature of reflow;

(2) the curing temperature of the thermoplastic resin is lower than the solidification temperature of the solder ball.

The examples of solder for the solder ball are listed with corresponding melting and solidification temperatures in Table 1 and the examples of the thermoplastic resin with corresponding softening temperatures in Table 2. The marketed products are available for the solder ball 50 and the thermoplastic resin 75 for the embodiment.

TABLE 1

| Solder | Melting temperature | Solidification temperature |
| --- | --- | --- |
| Sn/Sb5 | 240 C.° | 235 C.° |
| Sn/Ag3.0/Cu0.5 | 220 C.° | 218 C.° |
| Sn—37Pb | 183 C.° | 185 C.° |

TABLE 2

| Resin | Softening temperature |
| --- | --- |
| Polyolefin (PPET2110: name of article supplied by Toagosei Company, Limited) | 150 C.° |
| Polyester (PES-120L: name of article supplied by Toagosei Company, Limited) | 125 C.° |

The flux prevention wall 22 of the present embodiment may be formed on either of interposer 20 or the electronic circuit board 10 and may be formed separately from both the interposer 20 and electronic circuit board 10. Further, the underfill material may be filled between the photoelectric conversion array 30 and the interposer 20 and between the electronic circuit board 40 and the interposer 20. Still further, the microlens array may be arranged in the optical coupling portion.

The Fourth Embodiment

In the first to third embodiments, the groove fitting with the flux prevention wall 22 is formed on at least one of electronic circuit board 10 and the interposer 20. However, the groove is not always needed. The opto-electronic circuit board 103 according to the fourth embodiment does not include a groove fitting with the flux prevention wall.

Figure 16:
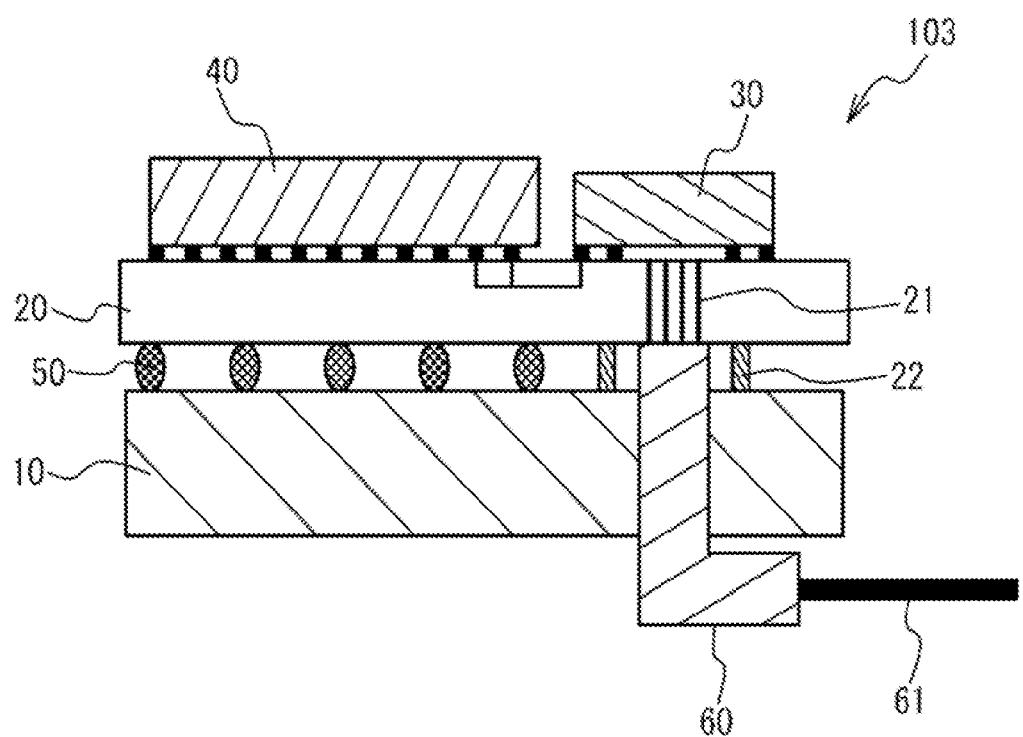
FIG. 16 is a diagram illustrating a schematic section view of the opto-electronic circuit board.

FIG. 16 is a schematic section view of the opto-electronic circuit board 103. As illustrated in FIG. 16, any groove fitting with the flux prevention wall 22 is not formed on the electronic circuit board 10 or the interposer 20. The flux prevention wall 22 is fixed to at least one of the electronic circuit board 10 and the interposer 20. Thus, the optical coupling portion formed in the inner space of the flux prevention wall 22 is prevented effectively from the adhesion of the scattering flux and the particles or the like. Accordingly, even in the opto-electronic circuit board 103 may be prevented the optical loss in the optical portion to be caused by the adhesion.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An opto-electronic circuit board comprising:
a first board;
a second board coupled with the first board via solder, an electronic circuit and a photoelectric conversion device being mounted on the second board; and
a wall disposed between an optical coupling portion and the solder, the optical coupling portion being for optically coupling an optical waveguide with the photoelectric conversion device, the optical waveguide being formed in the first board, the wall being disposed apart from the optical coupling portion.

2. The opto-electronic circuit board according to claim 1, further comprising:
a groove formed on at least one of the first board and the second board, the groove fitting the wall.

3. The opto-electronic circuit board according to claim 2, wherein thermoplastic resin is applied to the groove.

4. The opto-electronic circuit board according to claim 3, wherein a curing temperature of the thermoplastic resin is lower than a solidification temperature of the solder.

5. The opto-electronic circuit board according to claim 1, wherein the second board includes an optical waveguide which passes through the second board in a direction of a thickness of the second board and optically couples with the photoelectric conversion device, and the optical coupling portion is a portion at which the optical waveguide of the second board and an optical connector are optically coupled.

6. The opto-electronic circuit board according to claim 2, wherein the second board includes an optical waveguide which passes through the second board in a direction of a thickness of the second board and optically couples with the photoelectric conversion device, and the optical coupling portion is a portion at which the optical waveguide of the second board and an optical connector are optically coupled.

7. The opto-electronic circuit board according to claim 3, wherein the second board includes an optical waveguide which passes through the second board in a direction of a thickness of the second board and optically couples with the photoelectric conversion device, and the optical coupling portion is a portion at which the optical waveguide of the second board and an optical connector are optically coupled.

8. The opto-electronic circuit board according to claim 4, wherein the second board includes an optical waveguide which passes through the second board in a direction of a thickness of the second board and optically couples with the photoelectric conversion device, and the optical coupling portion is a portion at which the optical waveguide of the second board and an optical connector are optically coupled.

9. The opto-electronic circuit board according to claim 1, wherein the optical coupling portion is a portion at which a first lens and a second lens are optically coupled, the first lens and the second lens are opposed each other, the first lens being optically coupled with the photoelectric conversion device, the second lens is mounted on the first board.

10. The opto-electronic circuit board according to claim 2, wherein the optical coupling portion is a portion at which a first lens and a second lens are optically coupled, the first lens and the second lens are opposed each other, the first lens being optically coupled with the photoelectric conversion device, the second lens is mounted on the first board.

11. The opto-electronic circuit board according to claim 3, wherein the optical coupling portion is a portion at which a first lens and a second lens are optically coupled, the first lens and the second lens are opposed each other, the first lens being optically coupled with the photoelectric conversion device, the second lens is mounted on the first board.

12. The opto-electronic circuit board according to claim 4, wherein the optical coupling portion is a portion at which a first lens and a second lens are optically coupled, the first lens and the second lens are opposed each other, the first lens being optically coupled with the photoelectric conversion device, the second lens is mounted on the first board.

13. A method of fabricating an opto-electronic circuit board comprising:
arranging solder and a wall, the solder being arranged between a first board and a second board, an optical waveguide being mounted on the first board, an electronic circuit board and a photoelectric conversion device being mounted on the second board, the wall being arranged between the solder and an optical portion at which the optical waveguide and the photoelectric conversion device are optically coupled, the wall being disposed apart from the optical coupling portion; and
performing reflow treatment for melting the solder.

14. The method of fabricating an opto-electronic circuit board according to claim 13, wherein the wall is fitted in a groove formed on at least one of the first board and the second board in the arranging.

15. The method of fabricating an opto-electronic circuit board according to claim 14, further comprising an applying thermoplastic resin in the groove before the performing the reflow treatment.

16. The method of fabricating an opto-electronic circuit board according to claim 15, wherein a curing temperature of the thermoplastic resin is lower than a solidification temperature of the solder.

* * * * *